United States Patent
Salvi et al.

(10) Patent No.: US 9,712,140 B1
(45) Date of Patent: Jul. 18, 2017

(54) TUNABLE MULTI-PATH FILTER

(71) Applicant: MOTOROLA SOLUTIONS, INC., Schaumburg, IL (US)

(72) Inventors: Raul Salvi, Boca Raton, FL (US); Joseph P. Heck, Fort Lauderdale, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/190,072

(22) Filed: Jun. 22, 2016

(51) Int. Cl.
*H03H 11/12* (2006.01)
*H03H 11/04* (2006.01)
(Continued)

(52) U.S. Cl.
CPC ......... *H03H 11/0472* (2013.01); *H03H 11/06* (2013.01); *H04B 1/1081* (2013.01); *H04L 7/0016* (2013.01); *H03H 2210/012* (2013.01); *H03H 2210/025* (2013.01); *H03H 2210/026* (2013.01); *H03H 2210/028* (2013.01)

(58) Field of Classification Search
CPC ...... H04B 1/1081; H04B 1/16; H03H 19/002; H03H 7/0138; H03H 11/04; H03H 11/06; H03H 11/0472; H03H 2210/012; H03H 2210/025; H03H 2210/026;
(Continued)

(56) References Cited

U.S. PATENT DOCUMENTS 3,717,816 A 2/1973 Langer
5,663,675 A * 9/1997 O'Shaughnessy ..... H03H 11/04
327/100
(Continued)

FOREIGN PATENT DOCUMENTS

EP 185416 6/1986
GB 1366782 9/1974
(Continued)

OTHER PUBLICATIONS

Mirzaei et al., "A 65 nm CMOS Quad-Band SAW-Less Receiver SoC for GSM/GPRS/EDGE," journal (2011) IEEE Journal of Solid-State Circuits, vol. 46, No. 5, pp. 950-964.
(Continued)

*Primary Examiner* — Thanh Le
(74) *Attorney, Agent, or Firm* — Michael Best & Friedrich LLP

(57) ABSTRACT

A tunable multi-path filter, a method for filtering a radio frequency signal with the tunable multi-path filter, and a communication device including the tunable multi-path filter. In one embodiment, the tunable multi-path filter includes a voltage controlled current source, an oscillator source, and at least two filter paths. The voltage controlled current source for receiving a radio frequency (RF) signal and generating a current signal. The oscillator source for generating a tunable clock signal. Each of the at least two filter paths are coupled to the voltage controlled current source and the oscillator source, and are configured to generate an output voltage signal based at least in part on the current signal and the tunable clock signal. In some embodiments, the tunable multi-path filter further includes a carrier signal rejection component that is configured to reduce the carrier feedthrough in the output voltage signals.

20 Claims, 10 Drawing Sheets

(51) Int. Cl.
*H03H 11/06* (2006.01)
*H04B 1/10* (2006.01)
*H04L 7/00* (2006.01)

(58) Field of Classification Search
CPC ............ H03H 2210/028; H04L 7/0016; H04L 27/148; H04J 3/025; H03D 7/161
See application file for complete search history.

(56) References Cited

U.S. PATENT DOCUMENTS

| | | | | |
|---|---|---|---|---|
| 5,953,379 | A * | 9/1999 | Myers | H03C 3/0908 327/553 |
| 8,970,293 | B1 * | 3/2015 | Salvi | H03H 11/126 327/552 |
| 2002/0122519 | A1 * | 9/2002 | Douglas | H03M 1/0629 375/376 |
| 2012/0139647 | A1 * | 6/2012 | Schoepf | H03B 5/32 331/35 |
| 2013/0271210 | A1 | 10/2013 | Riley | |
| 2015/0133068 | A1 | 5/2015 | Aggarwal et al. | |
| 2016/0233848 | A1 * | 8/2016 | Mak | H03H 19/004 |

FOREIGN PATENT DOCUMENTS

| | | |
|---|---|---|
| JP | 6237149 | 2/1987 |
| WO | 2015086892 | 6/2015 |

OTHER PUBLICATIONS

Ghaffari et al., "Tunable High-Q N-Path Band-Pass Filters:Modeling and Verification," journal (2011) IEEE Journal of Solid-State Circuits, vol. 46, No. 5, pp. 998-1010.

Murphy et al., "A Blocker-Tolerant, Noise-Cancelling Receiver Suitable for Wideband Wireless Applications," IEEE journal (Dec. 2012) IEEE Journal of Solid-State Circuits, vol. 47, No. 12, pp. 2943-2963.

* cited by examiner

TUNABLE MULTI-PATH FILTER

BACKGROUND OF THE INVENTION

Conventional radio products use a surface acoustic wave (SAW) filter to filter a radio frequency (RF) signal. The surface acoustic wave filter is an electromechanical device that converts electrical signals to a mechanical wave using the piezoelectric effect of a piezoelectrical crystal or ceramic material. The mechanical wave is delayed as the mechanical wave propagates across the surface of the piezoelectrical crystal or ceramic material. When the delayed mechanical wave is converted back to an electrical signal, the converted electrical signal may be used as a direct analog implementation of a finite impulse response filter. However, surface acoustic wave filters may be limited to frequencies up to approximately three (3) gigahertz (GHz) and have a fixed center frequency and bandwidth. Accordingly, conventional radio products require one or more surface acoustic wave filters for each frequency band of the radio product.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
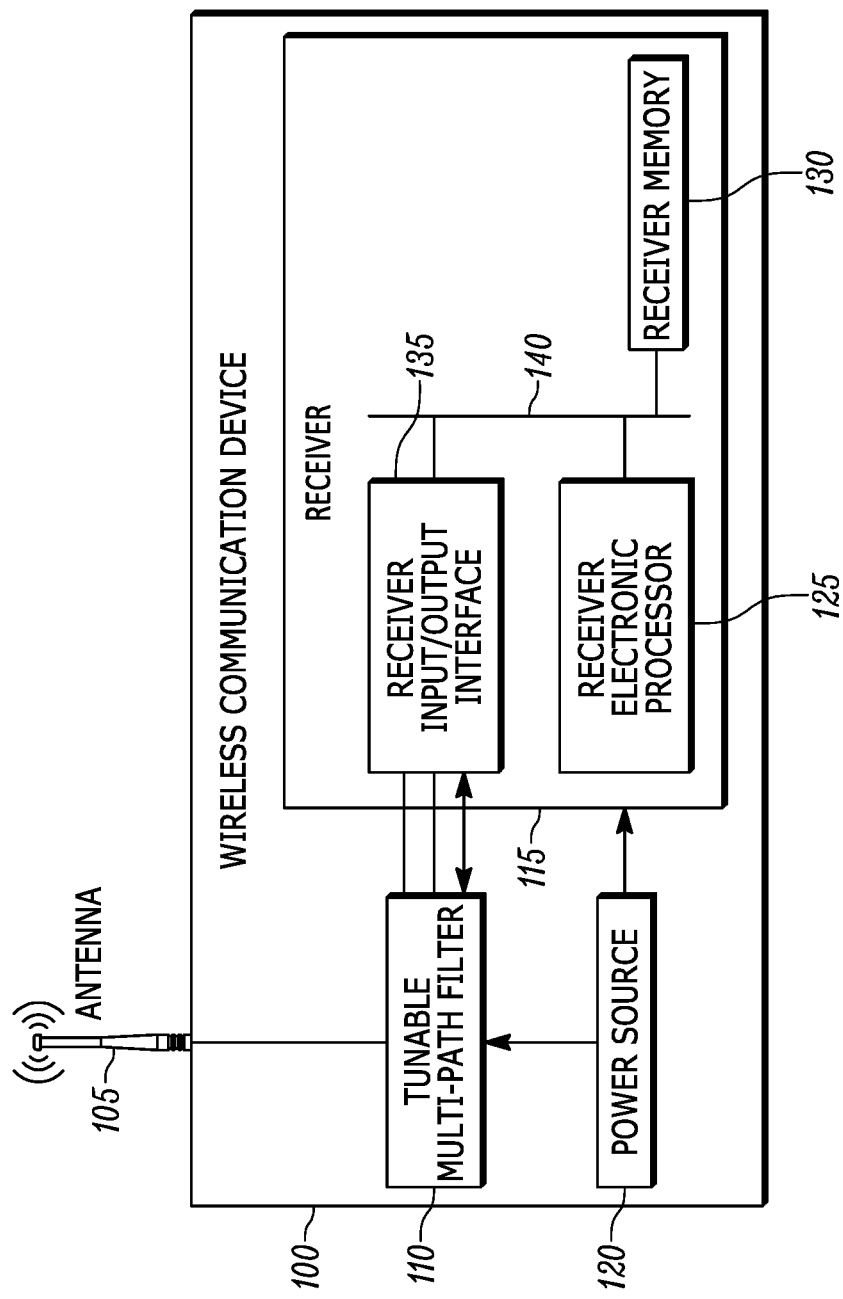
FIG. 1 is a block diagram of a wireless communication device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In one embodiment, a tunable multi-path filter is provided that includes a voltage controlled current source for receiving a radio frequency (RF) signal and generating a current signal, an oscillator source for generating a tunable clock signal, and at least two filter paths. Each of the at least two filter paths are coupled to the voltage controlled current source and the oscillator source, and are configured to generate an output voltage signal based at least in part on the current signal and the tunable clock signal.

In another embodiment, a method of filtering a radio frequency signal with a tunable multi-path filter is provided. The method includes receiving, with a voltage controlled current source, a radio frequency (RF) signal. The method further includes generating, with the voltage controlled current source, a current signal based on the radio frequency (RF) signal; and generating, with an oscillator source, a tunable clock signal. The method also includes outputting, with at least two filter paths, at least two output voltage signals based at least in part on the current signal and the tunable clock signal.

In yet another embodiment, a communication device is provided that includes an antenna, a tunable multi-path filter, and a receiver. The antenna receives a radio frequency (RF) signal. The tunable multi-path filter has a voltage controlled current source for receiving the radio frequency signal and generating a current signal, an oscillator source for generating a tunable clock signal, and at least two filter paths. Each of the at least two filter paths are coupled to the voltage controlled current source and the oscillator source, and are configured to generate an output voltage signal based at least in part on the current signal and the tunable clock signal. The receiver is configured to receive the output voltage signal from the at least two filter paths of the tunable multi-path filter.

FIG. 1 is a block diagram of a wireless communication device 100 in accordance with some embodiments. As illustrated in FIG. 1, the wireless communication device 100 includes, among other things, an antenna 105, a tunable multi-path filter 110, a receiver 115, and a power source 120. In some embodiments, the power source 120 may be a battery, a rechargeable battery, or other suitable power source. The wireless communication device 100 may include additional or different components than those components illustrated in FIG. 1 and may be configured to perform additional functionality than the functionality described herein.

The receiver 115 may include a receiver electronic processor 125, a receiver memory 130, and a receiver input/output (I/O) interface 135. The receiver electronic processor 125, the receiver memory 130, and the receiver input/output interface 135 communicate over one or more communication buses 140. The receiver 115 may include additional or different components than those components illustrated in FIG. 1 and may be configured to perform additional functionality than the functionality described herein.

The receiver memory 130 may include a program storage area (e.g., read only memory (ROM)) and a data storage area (e.g., random access memory (RAM), and other non-transitory, computer-readable medium). For example, the data storage area of the receiver memory 130 may store (for example, in a lookup table or other suitable format) information regarding the tunable multi-path filter 110 (e.g., a DC offset correction signal or output voltage signals from the tunable multi-path filter 110 as described in greater detail below).

The receiver electronic processor 125 (e.g., a microprocessor or other suitable processing device) is coupled to the receiver memory 130 and executes machine-readable instructions stored in the receiver memory 130. For example, instructions stored in the receiver memory 130, when executed by the receiver electronic processor 125, may cause the receiver 115 to communicate with and/or control the tunable multi-path filter 110 via the receiver input/output interface 135 using one or more external communication buses 140.

The receiver input/output interface 135 receives inputs, provides outputs, or a combination thereof. In some embodiments, the receiver input/output interface 135 receives an input (for example, output voltage signals) from the tunable multi-path filter 110 or an electronic processor external to the receiver. Similarly, in some embodiments, the receiver input/output interface 135 provides an output to the tunable multi-path filter 110 or to the electronic processor external to the receiver 115 through one or more output mechanisms.

Figure 2:
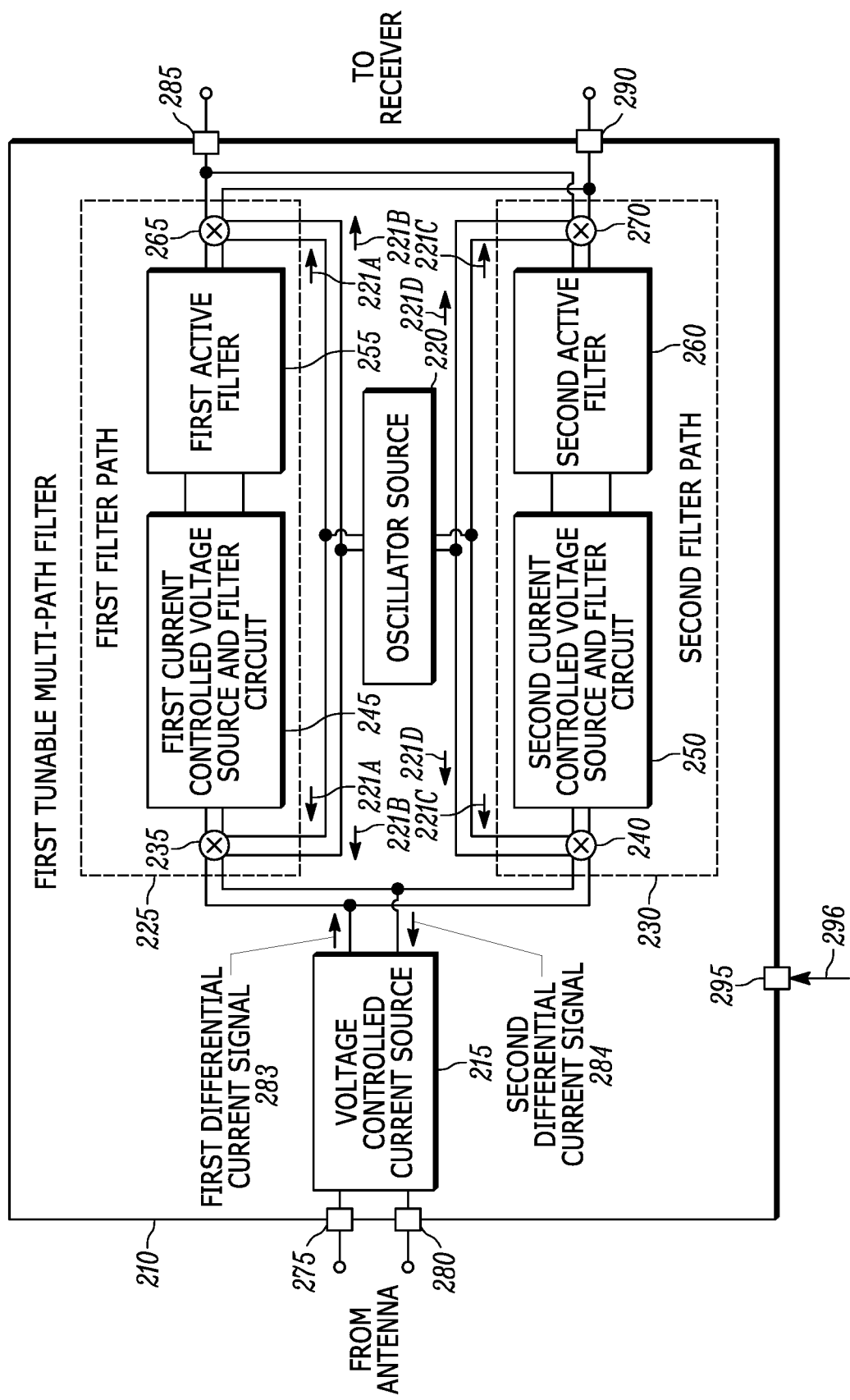
FIG. 2 is a block diagram of a first tunable multi-path filter of the wireless communication device in FIG. 1 in accordance with some embodiments.

FIG. 2 is a block diagram of a first tunable multi-path filter 210, which may be used to implement the tunable multi-path filter 110 of the wireless communication device 100 in FIG. 1 in accordance with some embodiments. The first tunable multi-path filter 210 includes, among other things, a voltage controlled current source 215, an oscillator source 220, a first filter path 225, and a second filter path 230. The first filter path 225 includes a first input mixer circuit 235, a first current controlled voltage source and filter circuit 245, a first active filter 255, and a first output mixer circuit 265. The second filter path 230 includes a second input mixer circuit 240, a second current controlled voltage source and filter circuit 250, a second active filter 260, and a second output mixer circuit 270. In the embodiment of FIG. 2, the first tunable multi-path filter 210 also includes a first input node 275 and a second input node 280, a first output node 285 and a second output node 290, and a control node 295. The first input node 275 and the second input node 280 form a differential input and may be coupled to the antenna 105 as described in FIG. 1. The first output node 285 and the second output node 290 form a differential output and may be coupled to the receiver input/output interface 135 as described in FIG. 1. The control node 295 may be coupled to various tunable components of the tunable multi-path filter 210 including the oscillator source 220, the first current controlled voltage source and filter circuit 245, the second current controlled voltage source and filter circuit 250, the first active filter 255, the second active filter 260, or some combination thereof. In some embodiments, the control node 295 may be one or more control nodes each being coupled to one or more of the oscillator source 220, the first current controlled voltage source and filter circuit 245, the second current controlled voltage source and filter circuit 250, the first active filter 255, and the second active filter 260.

For ease of understanding, the following is a description of one signal through the first filter path 225. However, the description similarly applies to differential signals through the first filter path 225. Additionally, the description of the first filter path 225 similarly applies to the second filter path 230 or other filter paths as described in greater detail below. Stated differently, the first filter path 225 and the second filter path 230 have similar components and circuitry and function similarly. Therefore, the description of the first filter path 230 is a description that may be applied to the second filter path 230. As a consequence, the second filter path 230 is not described in greater detail.

As illustrated in FIG. 2, the voltage controlled current source 215 receives, at the two input nodes 275 and 280, a radio frequency (RF) signal (e.g., a differential voltage signal) from the antenna 105 (not shown) and generates a first differential current signal 283 and a second differential current signal 284 (the first differential current signal 283 and the second differential current signal 284 are collectively referred to as "the current signal") based on the radio frequency signal. In some embodiments, the voltage controlled current source 215 is a transconductance amplifier or a low-noise transconductance amplifier that receives the radio frequency signal and outputs a current signal based on the radio frequency signal. In some embodiments, low noise may be defined as a signal to noise ratio at an output that is less than about five (5) decibels (dB) worse than the signal to noise ratio at an input. This ratio may be referred to as the noise figure of merit of the first tunable multi-path filter 210. In other embodiments, the voltage controlled current source 215 generates a non-differential current signal instead of the first differential current signal 283 and the second differential signal 284.

In the example of FIG. 2, the oscillator source 220 is coupled to the first input mixer circuit 235 and the first output mixer circuit 265. However, in other embodiments, the oscillator source 220 may be external to the first tunable multi-path filter 210. In the illustrated embodiment of FIG. 2, the oscillator source 220 generates a plurality of tunable clock signal components, referred to as a first tunable clock signal component 221A, a second tunable clock signal component 221B, a third tunable clock signal component 221C, and a fourth tunable clock signal component 221D (collectively "a tunable clock signal 221"). The oscillator source 220 provides the first and second tunable clock signal components 221A and 221B to the first input mixer circuit 235. The oscillator source 220 also provides the first and second tunable clock signal components 221A and 221B to the first output mixer circuit 265. In some embodiments, the oscillator source 220 is a voltage controlled oscillator that may be tuned by adjusting an applied voltage to generate a clock signal having a frequency of, for example, about 0.1 gigahertz (GHz) to about 6.0 gigahertz (GHz). In other embodiments, the oscillator source 220 is a phase locked loop (PLL), a frequency synthesizer, or other suitable oscillator source. In some embodiments, the oscillator source 220 is a multi-phase local oscillator. For example, multi-phases may be generated by frequency dividers, or polyphase networks, or other methods for creating multiphase outputs from a single source. This frequency range is merely exemplary and, in some embodiments, a clock signal having a different frequency range is used.

Additionally, in the example of FIG. 2, the duty cycle of the multi-phase oscillator source outputs from the oscillator source 220 may be 25% and staggered in time. Stated differently, in the example of FIG. 2, the multi-phase oscillator source outputs from the oscillator source 220 are four non-overlapping local oscillator signals, each of the non-overlapping oscillator signals is provided to a respective mixer circuit. For example, the first input mixer circuit 235 may be driven with a set of two 25% duty cycle local oscillator signals provided as the first tunable clock signal component 221A and the second tunable clock signal component 221B. The first output mixer circuit 265 may be driven with the same set of two 25% duty cycle local oscillator signals provided as the first tunable clock signal component 221A and the second tunable clock signal component 221B.

Additionally, for example, the second input mixer circuit 240 may be driven with a second set of two 25% duty cycle local oscillator signals provided as the third tunable clock signal component 221C and the fourth tunable clock signal component 221D. The second output mixer circuit 270 may be driven with the same second set of two 25% duty cycle local oscillator signals provided as the third tunable clock signal component 221C and the fourth tunable clock signal component 221D.

Figure 9:
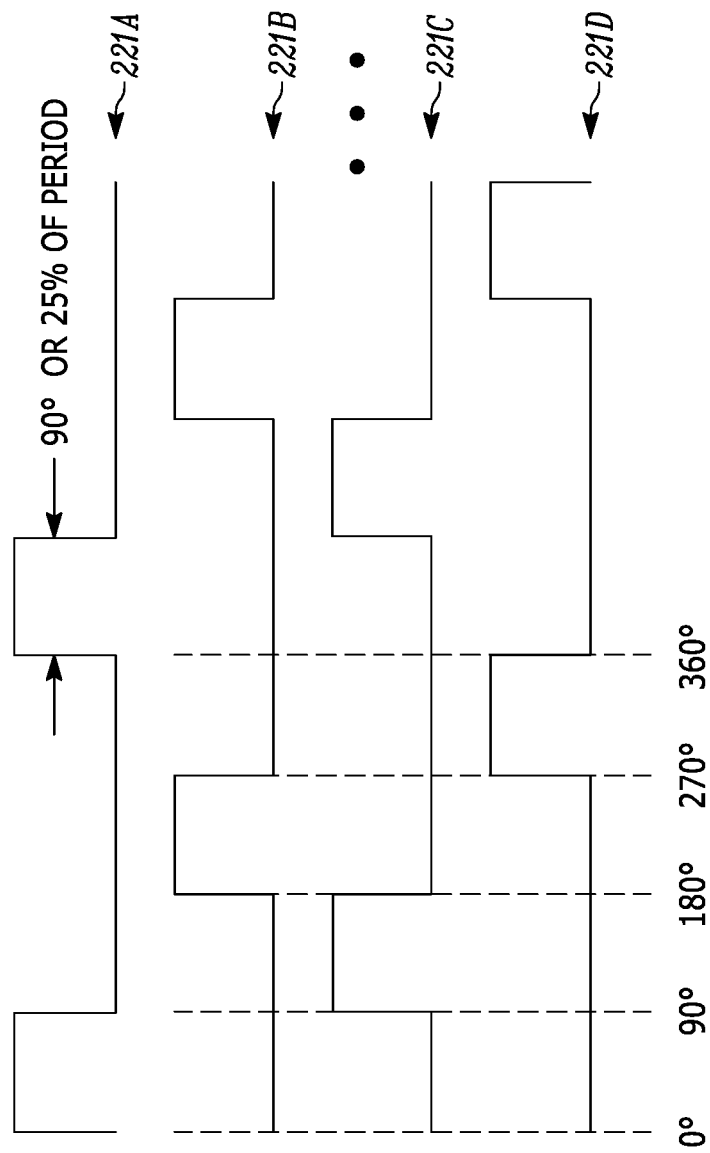
FIG. 9 is a diagram that illustrates waveforms from an oscillator source in accordance with some embodiments.

For example, FIG. 9 is a diagram that illustrates waveforms from the oscillator source 220. In the illustrated embodiment of FIG. 9, a first waveform of the first tunable clock signal component 221A has a phase of 0 degrees. A second waveform of the second tunable clock signal component 221B has a phase of 180 degrees. A third waveform of the third tunable clock signal component 221C has a phase of 90 degrees. A fourth waveform of the fourth tunable clock signal component 221D has a phase of 270 degrees.

The waveforms of FIG. 9 are merely exemplary and, in some embodiments, variations of these waveforms may be used. For example, some or all of the waveforms of FIG. 9 may be inverted or negative during their respective duty period depending on the type of devices and circuit configuration used. Additionally, the duty cycle, number of oscillator signals, and phase difference between these oscillator signals is merely exemplary and, in some embodiments, a different duty cycle, a different number of oscillator signals, and/or alternate phase differences between these oscillator signals may be used.

In some embodiments, the tunable multi-path filter 210 further includes the control node 295 for receiving a control input 296 (e.g., a voltage or multi-bit digital control input from the receiver input/output interface 135 as described in FIG. 1). The control input 296 is a control signal received at the control node 295 and the control input 296 may be used to tune the oscillator source 220. As described herein, "tuning" the oscillator source 220 is the function of changing the frequency of the tunable clock signal 221 from a first frequency to a second frequency. The tunable clock signal 221 of the oscillator source 220 sets a center frequency of the first tunable multi-path filter 210. For example, the frequency of the tunable clock signal 221 may be the center frequency of the tunable multi-path filter 210. The center frequency is a measure of a central frequency between the upper and lower cutoff frequencies of the tunable multi-path filter 210. For example, the center frequency is the arithmetic mean or the geometric mean of the lower cutoff frequency and the upper cutoff frequency of the bandpass response of the tunable multi-path filter 210. The center frequency of the bandpass filter response of the first tunable multi-path filter 210 is equal to the frequency of the tunable clock signal 221. The bandwidth of the bandpass filter response of the first tunable multi-path filter 210 is twice the bandwidth of the first and second active filters 255 and 260 (for example, identical low pass filters). In other words, the overall pass band of the first tunable multi-path filter 210 extends from the center frequency plus and minus the bandwidth of the first and second active filters 255 and 260. As described in greater detail below, in some embodiments, the bandwidth of the first tunable multi-path filter 210 is tunable and set, in each of the at least two filter paths 225 and 230, by at least one selected from a group of a tunable resistor, a tunable capacitor, or a tunable inductor.

The first input mixer circuit 235 is coupled to the voltage controlled current source 215, the oscillator source 220, and the first current controlled voltage source and filter circuit 245. The first input mixer circuit 235 mixes (for example, down-mixes) the current signal received from the voltage controlled current source 215 with a portion of the tunable clock signal 221 (for example, the first tunable clock signal component 221A and the second tunable clock signal component 221B) and generates a mixed current signal. The mixed current signal is provided to the first current controlled voltage source and filter circuit 245. The first current controlled voltage source and filter circuit 245 is a transimpedance amplifier, or other suitable current-to-voltage converter.

Figure 3:
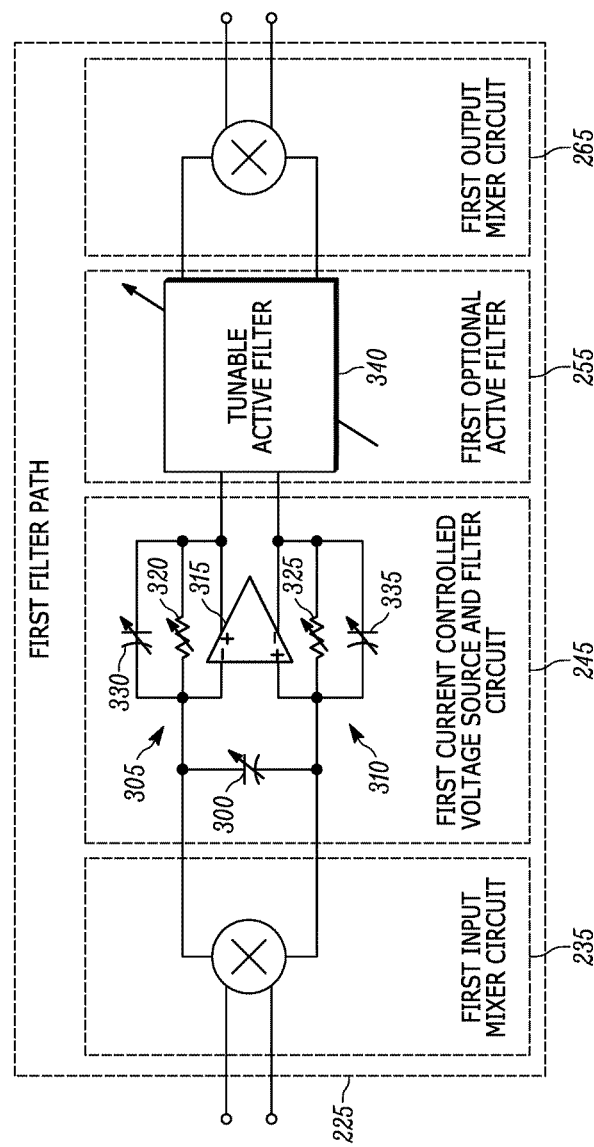
FIG. 3 is a block diagram of the first filter path of the tunable multi-path filter in FIG. 2 in accordance with some embodiments.

FIG. 3 illustrates an embodiment of the first filter path 225 in further detail. The first current controlled voltage source and filter circuit 245 receives the mixed current signal from the first input mixer circuit 235 at a tunable capacitor 300 (e.g., a tunable capacitor network). The tunable capacitor 300 is electrically connected in parallel with two parallel resistor-capacitor (RC) circuits 305 and 310, and an operational amplifier 315. The tunable capacitor 300 provides a first passive baseband filter pole. The frequencies being filtered by the tunable capacitor 300 may be set at the time of manufacturing. Additionally or alternatively, the frequencies being filtered by the tunable capacitor 300 may also be set according to the control signal at the control node 295 described above.

Each of the two parallel resistor-capacitor (RC) circuits 305 and 310 is a feedback circuit coupled between an output and an input of the operational amplifier 315. Each of the two parallel resistor-capacitor (RC) circuits 305 and 310 includes a feedback resistor 320 and 325 electrically coupled to an output and an input of the operational amplifier 315 and in parallel with capacitors 330 and 335, respectively. In the illustrated embodiment, the feedback resistors 320 and 325 and the capacitors 330 and 335 are separately tunable. The resistance of each of the feedback resistors 320 and 325 may be tuned at the time of manufacturing. Additionally or alternatively, the resistance of each of the feedback resistors 320 and 325 may be tuned according to the control signal at the control node 295 described above. The capacitance of each of the capacitors 330 and 335 may be tuned at the time of manufacturing. Additionally or alternatively, the capacitance of each of the capacitors 330 and 335 may be tuned according to the control signal at the control node 295 described above. The tuning of the feedback resistors 320 and 325 and/or the capacitors 330 and 335 increases or decreases the bandwidth and/or gain of the low pass filter response provided by the first current controlled voltage source and filter circuit 245.

The operational amplifier 315 receives the mixed current signal that is filtered by the tunable capacitor 300 and generates a voltage signal based on the filtered mixed current signal and feedback current signals provided by the two parallel resistor-capacitor (RC) circuits 305 and 310.

The low-pass frequency bandwidth of the first current controlled voltage source and filter circuit 245 is inversely proportional to the gain set by feedback resistors 320 and 325 between the outputs and the inputs of the operational amplifier 315. The resistance of the feedback resistors 320 and 325 set the gain and also affect the bandwidth of the first current controlled voltage source and filter circuit 245. The values of resistors 320 and 325 may be set to be equal in order to preserve the balance of the differential output voltage. Generally, higher resistance feedback resistors set a higher gain, reduce the maximum attainable bandwidth, and degrade in-band linearity, while lower resistance feedback resistors set a lower gain, increase attainable bandwidth, and degrade the system noise figure and takeover gain. The in-band gain of the first current controlled voltage source and filter circuit 245 is equal to the value of resistors 320 or 325 in Volts/Amp. In some embodiments, the feedback resistors 320 and 325 are between 1.25 kilohms (kΩ) and 5 kilohms (kΩ) and the corresponding average or overall receiver voltage gain is between 25 decibels (dB) and 37 decibels (dB). In other embodiments, resistors with resistive levels outside of this range are selected and the corresponding average gain is outside of the exemplary decibel range. The bandwidth of the first current controlled voltage source and filter circuit 245 may be between about 0.2 to about 56 megahertz in some embodiments, and at different frequency levels in other embodiments. Additionally, the feedback resistors 320 and 325 with the capacitors 330 and 335 of the parallel resistor-capacitor (RC) circuit set the low pass filter corner frequency ($f_C$) of the first current controlled voltage source and filter circuit 245 as defined by Equation 1 below, where $f_C$ is the corner frequency (Hz), where R is the resistance (Ohms, Ω) of the feedback resistors 320 and 325, and where C is the capacitance (Farads, F) of the capacitors 330 and 335, respectively.

$$f_C = 1/(2\pi RC) \quad (1)$$

The operational amplifier 315 may also be chopped (e.g., at 7.5, 10, 15, or 30 megahertz (MHz)) to improve the close in flicker (1/f) noise and to reduce the offset voltage. For example, a differential clock (e.g., a chopped clock) may be driven into the switching input/output stages of the operational amplifier 315 to effect the chopping. In some embodiments, the operational amplifier 315 also has one real pole.

The first current controlled voltage source and filter circuit 245 is coupled to the first input mixer circuit 235, and in some embodiments, a first active filter 255. The first current controlled voltage source and filter circuit 245 receives the mixed current signal, generates a voltage signal, filters the voltage signal, and outputs a filtered voltage signal. The first active filter 255 may provide additional filtering to the filtered voltage signal received from the first current controlled voltage source and filter circuit 245.

In the illustrated embodiment, the first active filter 255 includes a tunable active filter 340. The tunable active filter 340 may be, for example, an active resistor-capacitor (RC) baseband filter or Biquad Filter. The tunable active filter 340 may be tuned. In some embodiments, "tuning" the tunable active filter 340 may be the function of changing the capacitance of the tunable active filter 340 from a first capacitance to a one of several other values of capacitance, where the capacitance of the tunable active filter 340 corresponds to the bandwidth and/or gain of the low pass response of the first active filter 255 and the tunable multi-path filter 210. Additionally or alternatively, in some embodiments, "tuning" the tunable active filter 340 may also include the function of changing the resistance of the tunable active filter 340 from a first resistance to a one of several other values of resistance, where the resistance of the tunable active filter 340 corresponds to the bandwidth and/or gain of the low pass response of the first active filter 255 and the tunable multi-path filter 210.

For example, a tunable capacitor block and/or a variable resistor may be tuned to provide a corresponding bandwidth and/or gain at the time of manufacturing. Additionally or alternatively, in some embodiments, the tunable active filter 340 may also be tuned via the control node 295 as described above. For example, the control input 296 received at the control node 295 may set the amount of additional filtering provided by the tunable active filter 340 to a desired amount. In some embodiments, the desired amount of filtering is zero (0) or negligible. Accordingly, in these examples, the first current controlled voltage source and filter circuit 245 may provide the filtered voltage signal to the first output mixer circuit 265 without additional filtering provided by the first active filter 255.

In some embodiments, the gain and the bandwidth of the first active filter 255 may be set independently. For example, the average gain for each stage in the first active filter 255 may be between about positive four (4) decibels (dB) to about negative eight (8) decibels (dB). When the first active filter 255 has two stages, the average gain for each stage may be about negative sixteen (16) decibels (dB) to about positive eight (8) decibels (dB). In other embodiments, the gain of the first active filter 255 may be outside these exemplary decibel ranges.

The bandwidth of the first active filter 255 may be between about 0.2 to about 25 megahertz (MHz). Accordingly, as explained above, the first active filter 255 may be bypassed for baseband bandwidth requirements above 25 megahertz (MHz). In other embodiments, the bandwidth of the first active filter 255 may be outside this exemplary range, and the first active filter 255 may be bypassed at a higher or lower bandwidth. In one embodiment, the tunable active filter 340 of the first active filter 255 is a four pole Biquad filter. In some embodiments, the gain or attenuation range may be 24 decibels (dB). The maximum gain setting may be adjusted by 12 decibels (dB) or more depending on the configuration of first tunable multi-path filter 210. The first active filter 255 may also be a passive LC or RC filter as described earlier.

Referring back to FIG. 2, the first output mixer circuit 265 is coupled between the output nodes 285 and 290 of the first tunable multi-path filter 210 and the first active filter 255. In some embodiments, the first filter path 225 may include a bypass circuit with a switch to selectively couple or decouple the first active filter 255 between the first current controlled voltage source and filter circuit 245 and the first output mixer circuit 265. In some embodiments, the first current controlled voltage source and filter circuit 245 is coupled to the first output mixer circuit 265 instead of being coupled to the first active filter 255.

When the first output mixer circuit 265 is coupled to the current controlled voltage source and filter circuit 245, the first output mixer circuit 265 mixes (for example, up-mixes) the voltage signal from the current controlled voltage source and filter circuit 245 with a portion of the tunable clock signal 221 (for example, the first tunable clock signal component 221A and the second tunable clock signal component 221B) from the oscillator source 220 to generate a mixed voltage signal. When the first output mixer circuit 265 is coupled to the first active filter 255, the first output mixer 265 mixes (for example, up-mixes) the voltage signal from the first active filter 255 with a portion of the tunable clock signal 221 (for example, the first tunable clock signal component 221A and the second tunable clock signal component 221B) from the oscillator source 220 to generate a mixed voltage signal. The voltage signal from the current controlled voltage source and filter circuit 245 or the first active filter 255 has a low pass response to radio frequency signal received by the first tunable multi-path filter 210. The low pass response is translated to a bandpass filter response by the up-mixing of the first output mixer circuit 265.

The mixed voltage signal from the first output mixer circuit 265 is provided differentially to the two output nodes 285 and 290. The mixed voltage signal generated by the first output mixer circuit 265 is a band-pass filtered component of the radio frequency signal received at the differential input nodes 275 and 280 of the first tunable multi-path filter 210.

As noted above, the receiver 115 is coupled to the first and second output nodes 285 and 290. Also noted above, the description of FIGS. 2 and 3, which is a detailed description of the first filter path 225, may also be used as a detailed description of the second filter path 230 because the first and second filter paths 225 and 230 have similar components and circuitry and function similarly. For example, the components of the first input mixer circuit 235, the first current controlled voltage source and filter circuit 245, the first optional active filter 255, and the first output mixer circuit 265, as described above with respect to FIGS. 2 and 3, are similar to the components of the second mixer input circuit 240, the second current controlled voltage source and filter circuit 250, the second active filter 260, and the second output mixer circuit 270, respectively. Accordingly, the receiver 115 receives the filtered voltage signal from each of the first filter path 225 and the second filter path 230. The output voltage signals from the first filter path 225 and the second filter path 230 are a bandpass filter response of the radio frequency (RF) signal received by the first tunable multi-path filter 210. The center frequency of the bandpass filter response is set by the tunable clock signal, and the bandwidth of the bandpass filter response is tunable and set by one or more resistors and capacitors in the first filter path 225 and the second filter path 230.

Figure 4:
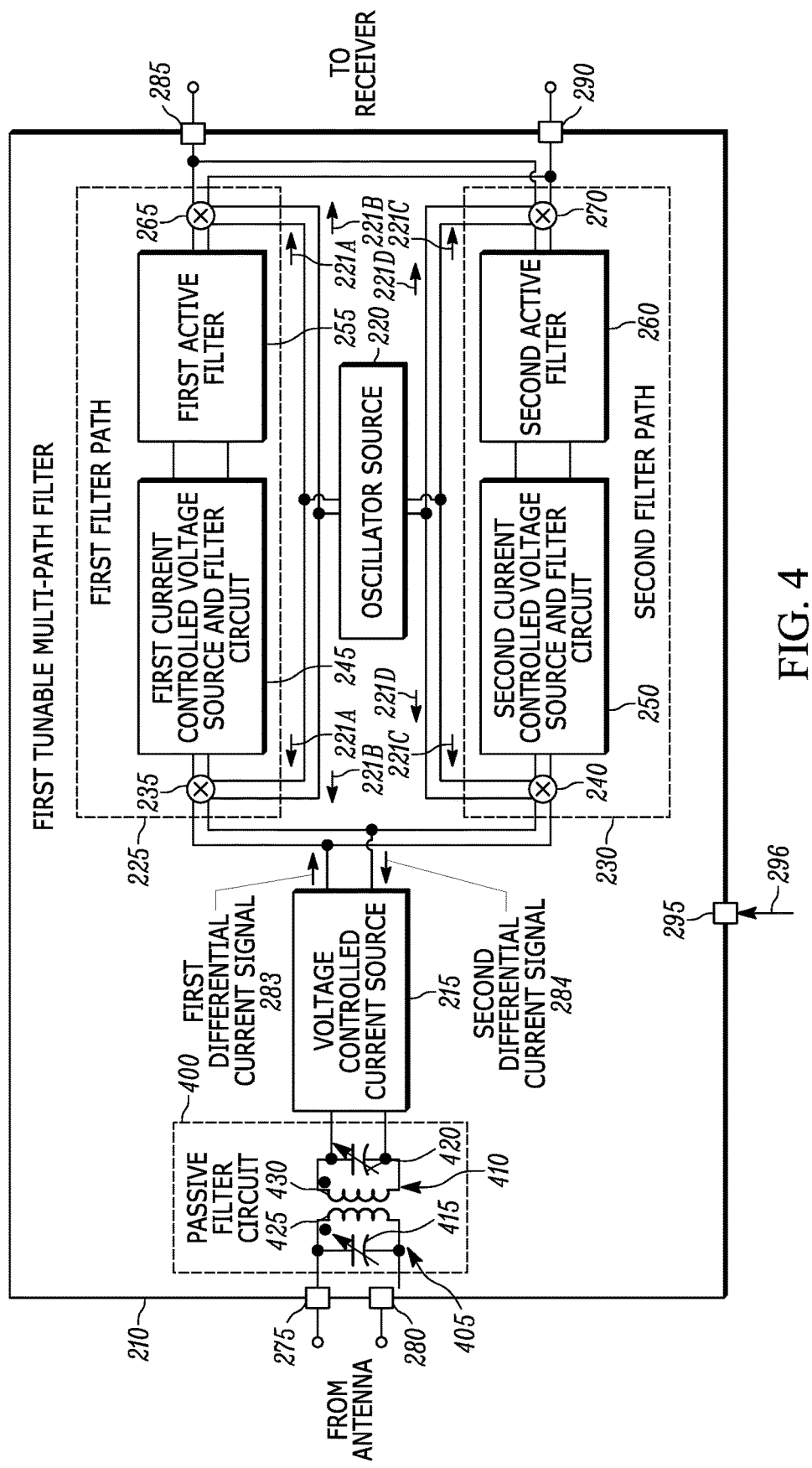
FIG. 4 is a block diagram of a second tunable multi-path filter of the wireless communication device in FIG. 1 in accordance with some embodiments.

FIG. 4 is a block diagram of a second tunable multi-path filter 390, which may be implemented as the tunable multi-path filter 110 of the wireless communication device 100 in FIG. 1 in accordance with some embodiments. The second tunable multi-path filter 390 includes, among other things, the voltage controlled current source 215, the oscillator source 220, the first filter path 225, the second filter path 230, the two input nodes 275 and 280, the two output nodes 285 and 290, and the control node 295 as described above in FIGS. 2 and 3. Components of the second tunable multi-path filter 390 sharing label numbers with components of the first tunable multi-path filter 210 are similar and the previous description of the components with respect to the first tunable multi-path filter 210 similarly applies to these components in the second tunable multi-path filter 390. As a consequence, these components will not be described again in greater detail.

The second tunable multi-path filter 390 also includes a passive filter circuit 400 coupled between the first and second input nodes 275 and 280 and the voltage controlled current source 215. The passive filter circuit 400 filters the radio frequency signal at the two input nodes 275 and 280 to suppress radio frequency interference (e.g., far-out blockers, and other harmonic and spurious responses in the radio frequency signal). For example, the magnetic coupling or mutual inductance provides a direct current (DC) block function from one inductor 425 (e.g., a primary winding) to another inductor 430 (e.g., a secondary winding).

In the example of FIG. 4, the passive filter circuit 400 is a tunable bandpass resonator and having a first inductor-capacitor (LC) filter circuit 405 and a second inductor-capacitor (LC) filter circuit 410 coupled to each other in parallel through their mutual inductance. The first inductor-capacitor (LC) filter circuit 405 includes a tunable capacitor 415 electrically coupled in parallel to an inductor 425. The second inductor-capacitor (LC) filter circuit 410 includes a tunable capacitor 420 electrically coupled in parallel to an inductor 430. The inductor 430 is coupled to the inductor 425 through their mutual inductance.

The first and second tunable capacitors 415 and 420 may each be a digital bank of switchable Metal-Insulator-Metal (MIM) capacitors. The amount of capacitance provided by the first and second tunable capacitors 415 and 420 may be set at the time of manufacturing. The amount of capacitance provided by the first and second tunable capacitors 415 and 420 may also be set according to a control signal. In some embodiments, the control input 296 received at the control node 295 may be applied to the first and second tunable capacitors 415 and 420 to set the amount of capacitance provided by the first and second tunable capacitors 415 and 420, which also sets the amount of filtering provided by the passive filter circuit 400. In some embodiments, the passive filter circuit 400 has five bits of tuning values or thirty-two discrete states. In other embodiments, fewer or additional tuning values and states are used. The passive filter circuit 400 may also include different or additional passive filters (e.g., a resistor-inductor-capacitor (RLC) filter circuit) that provide additional functionality not described herein. The passive filter circuit 400 may also be a conventional ladder LC network instead of a transformer or coupled-resonator configuration as shown. The passive filter circuit 400 may be a single-ended input or a differential input. The passive filter circuit 400 may also be a low pass response to provide simple harmonic blocking.

Figure 5:
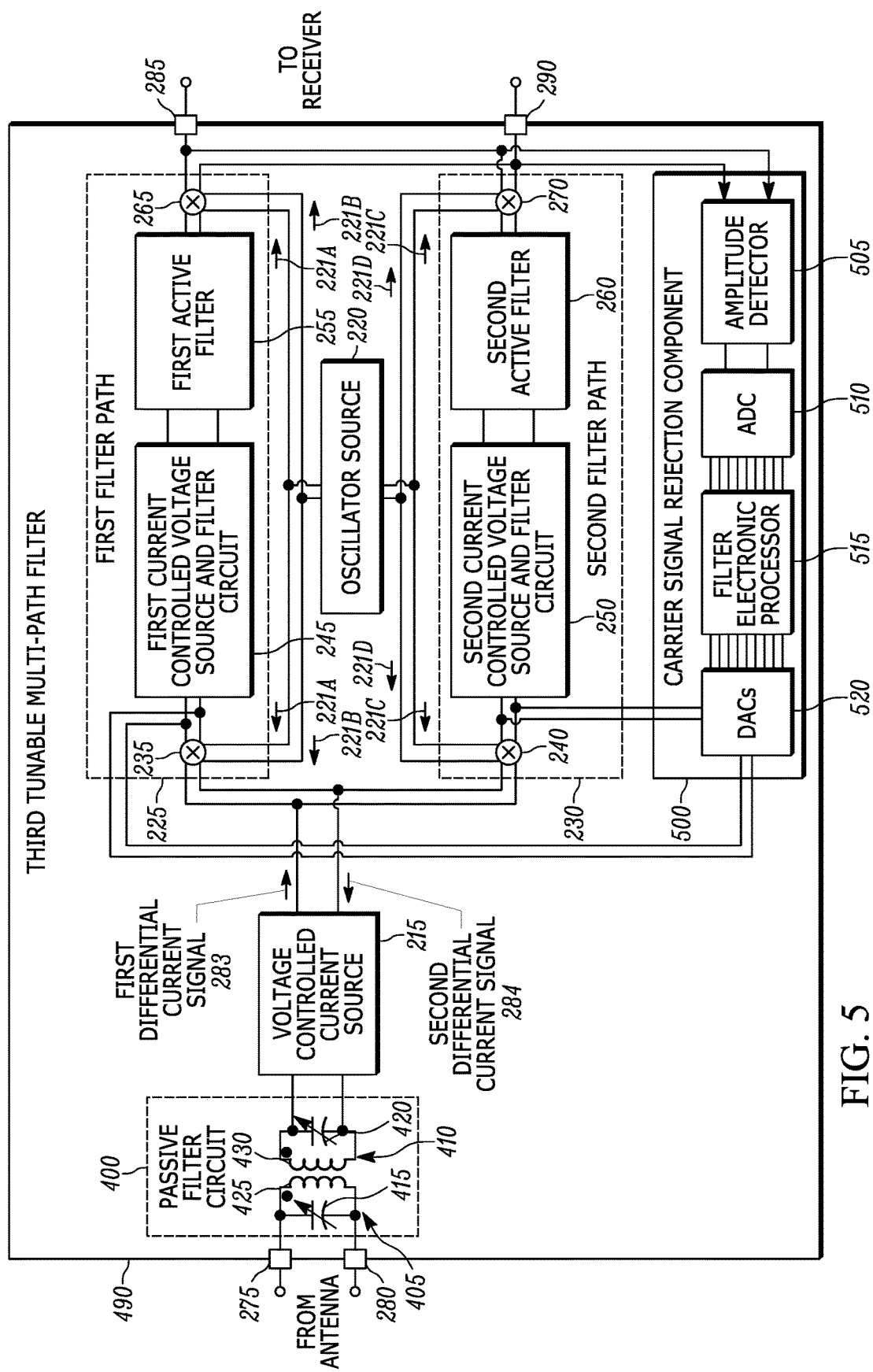
FIG. 5 is a block diagram of a third tunable multi-path filter of the wireless communication device in FIG. 1 in accordance with some embodiments.

FIG. 5 is a block diagram of a third tunable multi-path filter 490, which may be used to implement the tunable multi-path filter 110 of the wireless communication device 100 in FIG. 1 in accordance with some embodiments. The third tunable multi-path filter 490 includes, among other things, the voltage controlled current source 215, the oscillator source 220, and the first and second filter paths 225 and 230, the first and second input nodes 275 and 280, the first and second output nodes 285 and 290, the control node 295, and the passive filter circuit 400 as described above in FIG. 4. Components of the third tunable multi-path filter 490 sharing label numbers with components of the first and second tunable multi-path filters 210 and 390 are similar and the previous description of the components with respect to the first tunable multi-path filter 210 similarly applies to these components in the third tunable multi-path filter 490. As a consequence, these components will not be described again in greater detail.

The third tunable multi-path filter 490 of FIG. 5 also includes a carrier signal rejection component 500 coupled to the first and second output mixer circuits 265 and 270 and to the current controlled voltage source and filter circuits 245 and 250.

In the example of FIG. 5, the carrier signal rejection component 500 includes an amplitude detector 505, an analog-to-digital converter (ADC) 510, a filter electronic processor 515, and one or more digital-to-analog converters 520. The amplitude detector 505 receives the output voltage signals from the first and second output mixer circuits 265 and 270, and generates a DC output voltage that is log-linearly or otherwise proportional to the AC level of the output voltage signals. The amplitude detector 505 is coupled to the analog-to-digital converter 510 and provides the analog-to-digital converter 510 the generated DC output voltage proportional to the carrier power present at the output of the first and second output mixer circuits 265 and 270.

The analog-to-digital converter 510 converts the analog DC output voltage from the amplitude detector 505 to a corresponding digital input. The analog-to-digital converter 510 is coupled to the filter electronic processor 515 and provides the corresponding digital input to the filter electronic processor 515.

The filter electronic processor 515 (e.g., a microprocessor, logic circuit, or other suitable processing device) is electrically coupled to a filter memory (e.g., the filter memory may be similar to or the same as the receiver memory 130 described above) and executes machine-readable instructions stored in the memory. For example, instructions stored in the memory, when executed by the processor, may cause the filter electronic processor 515 to implement a carrier feedthrough minimization algorithm. The carrier feedthrough minimization algorithm implemented by the filter electronic processor 515, performs an up and down search by outputting a digital voltage signal at various levels until the filter electronic processor 515 detects, in the digital input from the analog-to-digital converter 510, that the carrier feedthrough is below a system defined threshold (for example, a threshold in a range between about −70 to about −90 decibel-milliwatts (dBm), or other suitable threshold based on the application). In other words, the filter electronic processor 515 functions as a comparator. When the filter electronic processor 515 detects that the carrier feedthrough is below the threshold, the filter electronic processor 515 stores information regarding the level of the digital voltage signal and maintains the level of the digital voltage signal to cancel any carrier feedthrough at the output of the third tunable multi-path filter 490.

The one or more digital-to-analog converters 520 may be a current digital-to-analog converter (IDAC) with two independent outputs and is coupled to the filter electronic processor 515 and the first current controlled voltage source and filter circuit 245 and the second current controlled voltage source and filter circuit 250. Alternatively, one or more the digital-to-analog converters 520 may be one or more current digital-to-analog converters (IDACs) each having an independent output. The one or more digital-to-analog converters 520 convert the digital voltage signals, received at various levels from the filter electronic processor 515, into a corresponding analog DC offset correction signals. The one or more digital-to-analog converters 520 provide a first independent analog DC offset correction signal to the first current controlled voltage source and filter circuit 245 and a second independent DC offset correction signal to the second current controlled voltage source and filter circuit 250. For example, the analog DC offset correction signals are injected into the feedback resistors across the operational amplifier 315 in the first current controlled voltage source and filter circuit 245 and operational amplifier 315 in the second current controlled voltage source and filter circuit 250 to reduce the carrier feedthrough caused by DC offsets in the first filter path 225 and second filter path 230.

The filter electronic processor 515 may also detect when the carrier feedthrough rises above or is above a threshold (for example, the threshold in a range between about −70 to about −90 decibel-milliwatts (dBm), or other suitable threshold based on the application). For example, when various aspects of the third tunable multi-path filter 490 are tuned, characteristics of the carrier feedthrough may change, causing the level of the DC offset correction signal to be insufficient to cancel the carrier feedthrough. In response, the filter electronic processor 515 (for example, functioning as a comparator) detects the change in the carrier feedthrough. In response to detecting that the DC offset correction signal is insufficient, the filter electronic processor 515 implements the carrier feedthrough minimization algorithm as described above.

The filter electronic processor 515 may have additional functionality separate from implementing the carrier feedthrough minimization algorithm. For example, the filter electronic processor 515 may communicate information (e.g., current voltage applied to the oscillator source 220) with other electronic processors (e.g., the receiver electronic processor 125) external to the third tunable multi-path filter 490. Additionally or alternatively, the filter electronic processor 515 may output one or more control signals similar to the control signals as described above to tune the tunable components of the third tunable multi-path filter 490.

The carrier signal rejection component 500 may include additional or different components than those components illustrated in FIG. 5 and may be configured to perform additional or different functionality than the functionality described herein, while still reducing the carrier feedthrough at the output of the third tunable multi-path filter 490. The functionality attributed to the carrier signal rejection component 500 described above may be performed differently or external to the third tunable multi-path filter 490. For example, the carrier signal rejection component 500 may be part of and performed by the receiver 115 as described above. The functionality attributed to the carrier signal rejection component 500 described above may be distributed among multiple devices, such as between the filter electronic processor 515 of the third tunable multi-path filter 490, the receiver electronic processor 125, and/or other suitable processing devices.

In some embodiments, the carrier signal rejection component 500 operates when the first current controlled voltage source and filter circuit 245 is not filtering a mixed current signal, and is idle when the first current controlled voltage source and filter circuit 245 is filtering a mixed current signal. In other embodiments, the carrier signal rejection component 500 operates concurrently or periodically to the filtering of the mixed current signal by the first current controlled voltage source and filter circuit 245. In some embodiments of the tunable multi-path filter 490, the passive filter circuit 400 is not included and the voltage controlled current source 215 is coupled to the first and second input nodes 275 and 280 as described in FIG. 2.

Figure 6:
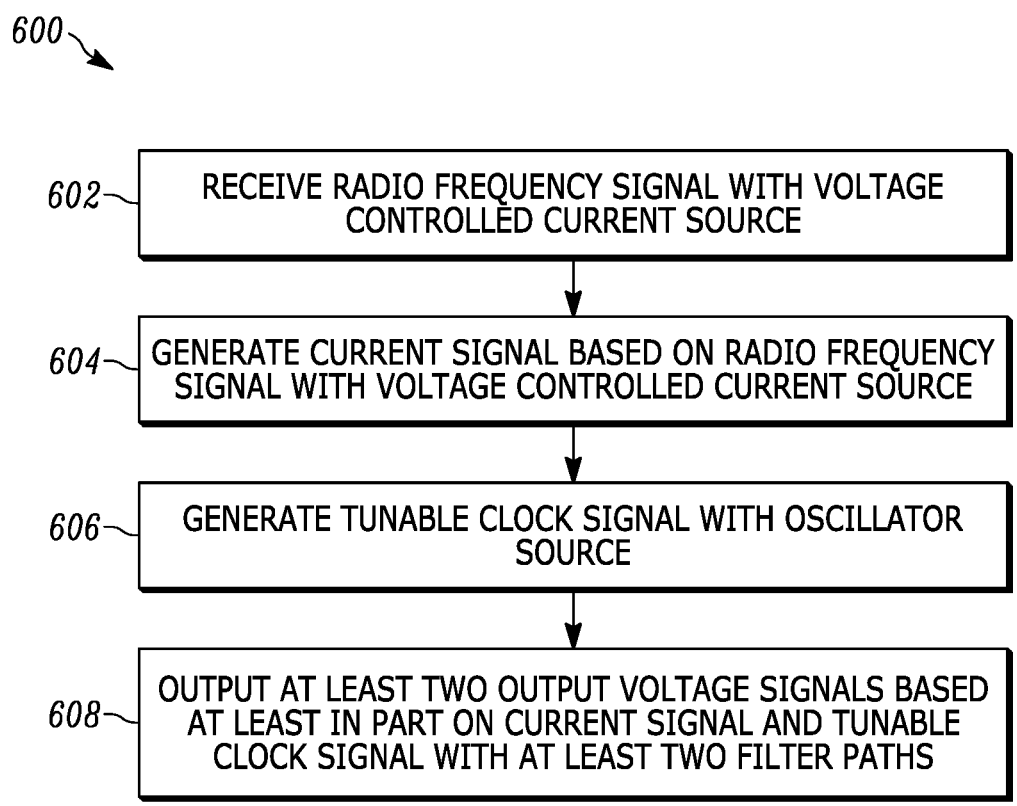
FIG. 6 is a flow chart illustrating a method of filtering a radio frequency signal with the tunable multi-path filter in accordance with some embodiments.

FIG. 6 is a flow chart illustrating a method 600 of filtering a radio frequency signal with the tunable multi-path filter 110 of FIG. 1 in accordance with some embodiments. Method 600 may be implemented by various embodiments of the tunable multi-path filter 110, including the tunable multi-path filter 210, 390, and 490, as well as by other embodiments of the tunable multi-path filter 110. However, the tunable multi-path filter 210 is used in the following description of the method 600 for exemplary purposes.

As illustrated in FIG. 6, the voltage controlled current source 215 receives a radio frequency signal (at block 602). For example, the voltage controlled current source 215 receives the radio frequency signal from the antenna 105 as described in FIG. 1 via the first and second input nodes 275 and 280.

The voltage controlled current source 215 generates a current signal based on the radio frequency signal (at block 604). For example, the voltage controlled current source 215 is a transconductance amplifier that generates a current signal that corresponds to a voltage component of the radio frequency signal.

The oscillator source 220 generates a tunable clock signal 221 based on a control input (at block 606). For example, the oscillator source 220 is a voltage controlled oscillator that receives the control input 296 and generates the tunable clock signal 221 with a frequency based on the control input 296.

The first and second filter paths 225 and 230 output at least two output voltage signals based at least in part on the current signal from the voltage controlled current source 215 and the tunable clock signal 221 from the oscillator source 220 (at block 608). For example, the first and second input mixer circuits 235 and 240 of the first and second filter paths 225 and 230 receive the current signal and a portion of the tunable clock signal 221 (for example, the first and second tunable clock signal components 221A and 221B or the third and fourth tunable clock signal components 221C and 221D) and generate respective mixed current signals based on the current signal and the portion of the tunable clock signal 221. The first and second current controlled voltage source and filter circuits 245 and 250 each receive one of the respective mixed current signals from the first and second input mixer circuits 235 and 245, respectively, and generate respective filtered voltage signals based on one of the respective mixed current signals. In some embodiments, the first and second active filters 255 and 260 each receive one of the respective filtered voltage signals from the first and second current controlled voltage source and filter circuits 245 and 250 and filter the respective filtered voltage signals to generate respective second filtered voltage signals based on the one of the respective filtered voltage signals. In some embodiments, the first and second output mixer circuits 265 and 270 each receive a portion of the tunable clock signal 221 (for example, the first and second tunable clock signal components 221A and 221B or the third and fourth tunable clock signal components 221C and 221D) and one of the respective second filtered voltage signals and generate respective output voltage signals based at least in part on the respective second filtered voltage signals and the portion of the tunable clock signal 221. In other embodiments, the first and second output mixer circuits 265 and 270 each receive a portion of the tunable clock signal 221 (for example, the first and second tunable clock signal components 221A and 221B or the third and fourth tunable clock signal components 221C and 221D) and one of the respective filtered voltage signals from the first and second current controlled voltage source 245 and 250 and generate respective output voltage signals based at least in part on the respective filtered voltage signals and the portion of the tunable clock signal 221.

In some embodiments, the method 600 further includes passively filtering the radio frequency signal. For example, the method 600 may include passively filtering the radio frequency signal with the passive filter circuit 400 as described in FIG. 4 before the radio frequency signal is received by the voltage controlled current source 215 in block 602.

Figure 7:
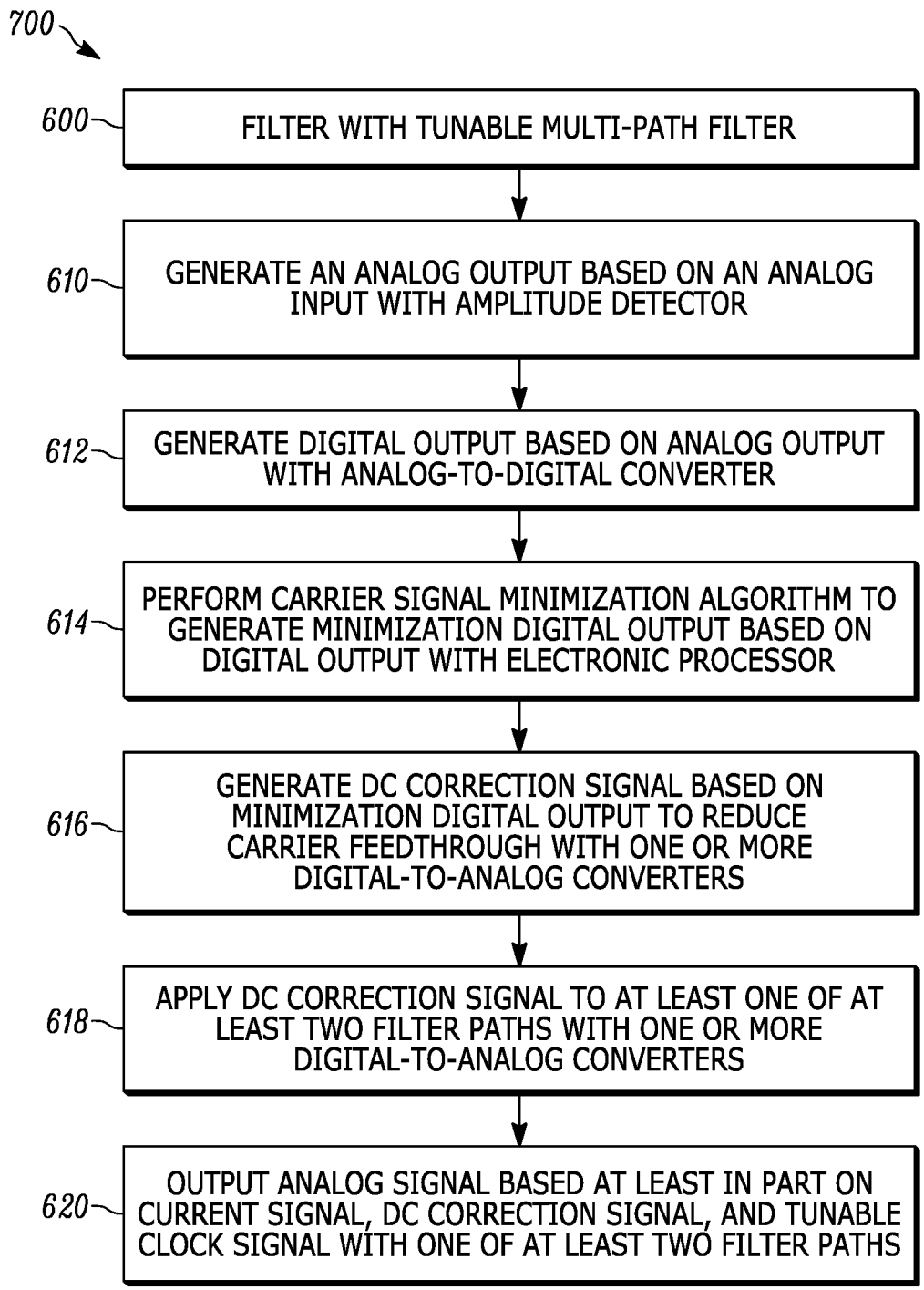
FIG. 7 is a flowchart that illustrates a method for reducing the carrier feedthrough in the output voltage signals from the tunable multi-path filter of the wireless communication device in FIG. 1 in accordance with some embodiments.

FIG. 7 is a flowchart that illustrates a method 700 for reducing the carrier signal in the output voltage signals from the tunable multi-path filter 110. The method 700 may be implemented by the tunable multi-path filter 110, and particularly, the tunable multi-path filter 490 of FIG. 5. The method 700 begins by the execution of the method 600 as described above. In other embodiments, the method 700 may also begin by activating the tunable multi-path filter 490 with the injection of the tunable clock signal 221 into the first and second input mixer circuits 235 and 240 and the first and second output mixer circuits 265 and 270, followed by the execution of the method 600 as described above.

As illustrated in FIG. 7, the amplitude detector 505 generates an analog output (for example, a differential DC voltage) based on an analog input (at block 610). For example, the amplitude detector 505 receives, as the analog input, the output voltage signal provided at nodes 285 and 290 by the first output mixer circuit 265 and the second output mixer circuit 270 and converts the analog input to an analog output that is proportional to the amplitude of the analog input. In some embodiments, the analog output generated by the amplitude detector 505 may be a differential DC voltage signal that is proportional to the amplitude of a differential AC voltage signal received by the amplitude detector 505 as the analog input.

The analog-to-digital converter 510 generates a digital output based on the analog output (at block 612). For example, the analog-to-digital converter 510 receives the analog output from the amplitude detector 505 and converts the analog output to a corresponding digital output.

The filter electronic processor 515 performs a carrier feedthrough minimization algorithm to generate a minimization digital output based on the digital output (at block 614). For example, the filter electronic processor 515 receives the digital output from the analog-to-digital converter 510 and performs an iterative up/down search to generate one or more minimization digital outputs based on the digital output of the amplitude detector 505. In some embodiments, the filter electronic processor 515 generates a minimization digital output for each filter path in the tunable multi-path filter 490 (e.g., a first minimization digital output for the first filter path 225 and a second minimization digital output for the first filter path 230). The first minimization digital output for the first filter path 225 in the tunable multi-path filter 490 is independent of the other minimization digital outputs including the second minimization digital output associated with the second filter path 230 in the tunable multi-path filter 490. In some embodiments, the filter electronic processor 515 may also detect whether the carrier feedthrough is above a threshold value.

The one or more digital-to-analog converters 520 generate a DC offset correction signal based on the minimization digital output to reduce carrier feedthrough (at block 616). For example, the one or more digital-to-analog converters 520 receive the one or more minimization digital outputs and generate one or more corresponding DC offset correction current signals. In some embodiments, the one or more digital-to-analog converters 520 include an independent digital-to-analog converter for each filter path of the tunable multi-path filter 490. In these embodiments, each of the independent digital-to-analog converters receives a minimization digital output associated with one path of the tunable multi-path filter 490 from the filter electronic processor 515 and generates a corresponding DC offset correction current signal.

The one or more digital-to-analog converters 520 apply the DC offset correction current signal to one of the at least two filter paths (for example, to one of the input mixer circuit, the current controlled voltage source and filter circuit, the active filter, or the output mixer circuit in at least one of the two filter paths) (at block 618). For example, the one or more digital-to-analog converters 520 respectively apply the one or more DC offset correction current signals to one of the input mixer circuits, the current controlled voltage source and filter circuits, the active filters, or the output mixer circuits of the at least two filter paths. In some embodiments, performing the carrier feedthrough minimization algorithm further includes controlling the one or more digital-to-analog converters to set a sign and a magnitude of the DC offset correction signal to reduce the carrier feedthrough, and iteratively controlling the one or more digital-to-analog converters to set different values of the sign and the magnitude of the DC offset correction signal when the electronic processor detects that the carrier feedthrough amplitude is above the threshold value.

At least one of the first or second filter paths 225 and 230 output an analog signal (for example, at least one of the at least two output voltage signals as described above) based at least in part on the current signal from the voltage controlled current source 215, the DC offset correction signal from the one or more digital-to-analog converters 520, and the tunable clock signal 221 from the oscillator source 220 (at block 620). For example, the first and second filter paths 225 and 230 may each output an analog differential signal (collectively forming the differential analog output signal of the tunable multipath filter 490) based at least in part on the current signal from the voltage controlled current source 215, the DC offset correction signal from one of the one or more digital-to-analog converters 520, and a portion the tunable clock signal 221 (for example, the first and second tunable clock signal components 221A and 221B or the third and fourth tunable clock signal components 221C and 221D) from the oscillator source 220.

Additionally, in some embodiments, the method 700 may include disconnecting or disabling the radio frequency (RF) signal input into the tunable multi-path filter 490 after executing method 600 and before block 610. In these embodiments, the method 700 further includes reconnecting or re-enabling the radio frequency (RF) signal input into the tunable multi-path filter 490 between blocks 618 and 620. The disabling and re-enabling of the radio frequency (RF) input into the tunable multi-path filter 490 may allow the carrier signal rejection component 500 to further isolate the carrier feedthrough signal in the analog input and increase the accuracy of minimization digital output generated by the carrier signal minimization algorithm.

Additionally, the disconnecting or disabling of the radio frequency (RF) signal input after executing method 600 and before block 610 is merely exemplary and, in some embodiments, the disconnecting or disabling of the radio frequency (RF) signal input may be performed at any point prior to block 620. For example, the disconnecting or disabling of the radio frequency (RF) signal input may be performed prior to filtering with the tunable multi-path filter 490 at block 600. The reconnecting or re-enabling of the radio frequency (RF) signal input between blocks 618 and 620 is merely exemplary and, in some embodiments, the reconnecting or re-enabling of the radio frequency (RF) signal input may be performed at any point after disconnecting or disabling the radio frequency (RF) signal input and prior to block 620. For example, the reconnecting or re-enabling of the radio frequency (RF) signal input may be performed after disconnecting or disabling the radio frequency (RF) signal input and prior to filtering with the tunable multi-path filter 490 at block 600.

Figure 8:
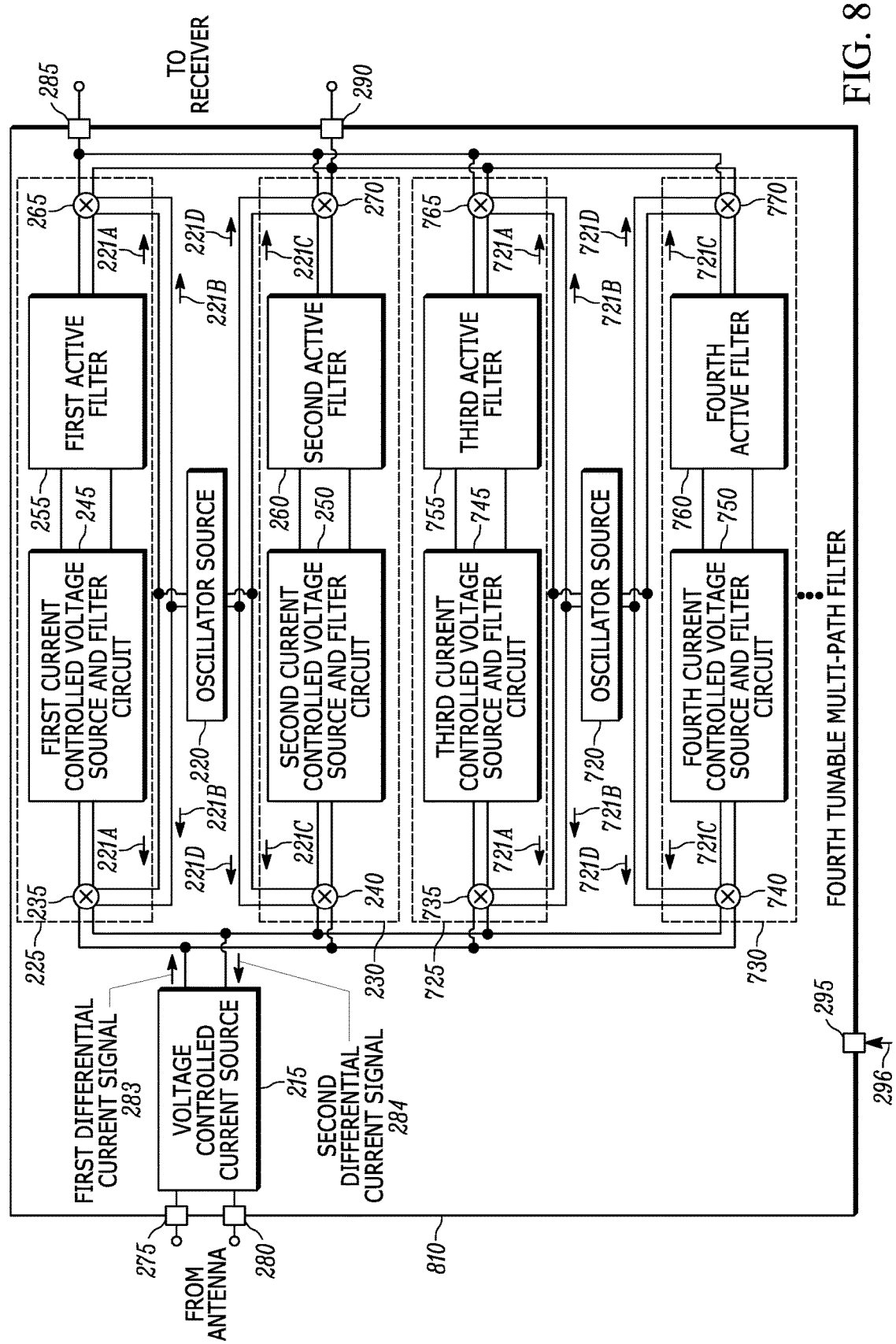
FIG. 8 is a block diagram of a fourth tunable multi-path filter of the wireless communication device in FIG. 1 in accordance with some embodiments.

FIG. 8 is a block diagram of a fourth tunable multi-path filter 810, which may be implemented as the tunable multi-path filter 110 of the wireless communication device 100 in FIG. 1 in accordance with some embodiments. The fourth tunable multi-path filter 810 includes, among other things, the voltage controlled current source 215, the oscillator source 220, and the first filter path 225, the second filter path 230, the two differential input nodes 275 and 280, the two differential output nodes 285 and 290, and the control node 295 as described above in FIGS. 2 and 3. Additionally, the fourth tunable multi-path filter 810 of FIG. 8 may also include the passive filter circuit 400 and/or the carrier signal rejection component 500 as described above in FIGS. 4 and 5. Components of the fourth tunable multi-path filter 810 sharing label numbers with components of the first, second, and third tunable multi-path filters 210, 390, and 490 are similar and the previous description of the components with respect to the first second, and third tunable multi-path filters 210, 390, and 490 similarly applies to these components in the fourth tunable multi-path filter 810. As a consequence, these components described above will not be described again in greater detail.

In the example of FIG. 8, the fourth tunable multi-path filter 810 also includes a second oscillator source 720, and third and fourth filter paths 725 and 730 as part of the at least two paths as described above. The second oscillator source 720 may be separate from and functionally similar to the oscillator source 220 as described above. For example, the second oscillator source 720 generates a plurality of tunable clock signal components, referred to as a fifth tunable clock signal component 721A, a sixth tunable clock signal component 721B, a seventh tunable clock signal component 721C, and an eighth tunable clock signal component 721D (collectively "a tunable clock signal 721"), which is similar to the plurality of tunable clock signal components generated by the oscillator source 220. In some embodiments, the second oscillator source 720 may be external to the fourth tunable multi-path filter 810. Alternatively, the second oscillator source 720 and the oscillator source 220 are the same or part of the same oscillator source.

In FIG. 8, the duty cycle of the multi-phase outputs from the oscillator sources 220 and 720 may be 12.5% and staggered in time. Stated differently, in the example of FIG. 8, the multi-phase outputs from the oscillator source 220 are four non-overlapping local oscillator signals, and the multi-phase output from the second oscillator source 720 are an additional four non-overlapping local oscillator signals, each of the eight non-overlapping oscillator signals is provided to respective mixer circuits. For example, a third input mixer circuit 735 of the third filter path 725 may be driven with a third set of two 12.5% duty cycle local oscillator signals provided as the fifth tunable clock signal component 721A and the sixth tunable clock signal component 721B. A third output mixer circuit 765 of the third filter path 725 may be driven with the same third set of two 12.5% duty cycle local oscillator signals provided as the fifth tunable clock signal component 721A and the sixth tunable clock signal component 721B.

Additionally, for example, a fourth input mixer circuit 740 of the fourth filter path 730 may be driven with a fourth set of two 12.5% duty cycle local oscillator signals provided as the seventh tunable clock signal component 721C and the eighth tunable clock signal component 721D. A fourth output mixer circuit 770 of the fourth filter path 730 may be driven with the same fourth set of two 12.5% duty cycle local oscillator signals provided as the seventh tunable clock signal component 721C and the eighth tunable clock signal component 721D.

Figure 10:
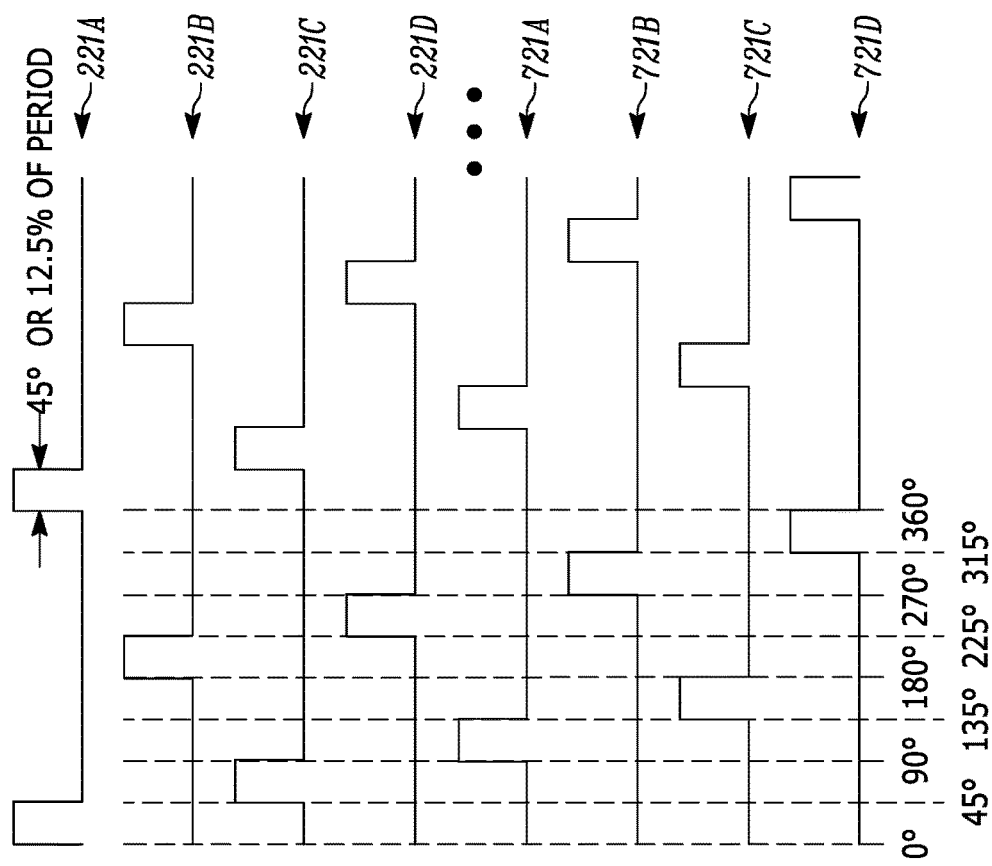
FIG. 10 is a diagram that illustrates waveforms from two oscillator sources in accordance with some embodiments.

For example, FIG. 10 is a diagram that illustrates waveforms from the oscillator source 220 and the second oscillator source 720. In the illustrated embodiment of FIG. 10, a first waveform of the first tunable clock signal component 221A has a phase of 0 degrees. A second waveform of the second tunable clock signal component 221B has a phase of 180 degrees. A third waveform of the third tunable clock signal component 221C has a phase of 45 degrees. A fourth waveform of the fourth tunable clock signal component 221D has a phase of 225 degrees. A fifth waveform of the fifth tunable clock signal component 721A has a phase of 90 degrees. A sixth waveform of the sixth tunable clock signal component 721B has a phase of 270 degrees. A seventh waveform of the seventh tunable clock signal component 721C has a phase of 135 degrees. An eighth waveform of the eighth tunable clock signal component 721D has a phase of 315 degrees.

The waveforms of FIG. 10 are merely exemplary and, in some embodiments, variations of these waveforms may be used. For example, some or all of the waveforms may be inverted or negative during their respective duty period depending on the type of devices and circuit configuration. The duty cycle, number of oscillator signals, and phase difference between these oscillator signals is merely exemplary and, in some embodiments, a different duty cycle, a different number of oscillator signals, and/or alternate phase differences between these oscillator signals may be used.

The phase difference between the non-overlapping local oscillator signals provided to the mixer circuits in the path 225 and the non-overlapping local oscillator signals provided to the mixer circuits in the path 725 is approximately 90 degrees. The phase difference between the non-overlapping local oscillator signals to the mixer circuits in the path 230 and the non-overlapping local oscillator signals to the mixer circuits in the path 730 is approximately 90 degrees. The phase difference between the non-overlapping local oscillator signals to the mixer circuits in the path 225 and the non-overlapping local oscillator signals to the mixer circuits in the path 230 is approximately 45 degrees. The phase difference between the non-overlapping local oscillator signals to the mixer circuits in the path 725 and the non-overlapping local oscillator signals to the mixer circuits in the path 730 is approximately 45 degrees.

The third filter path 725 and the fourth filter path 730 each include third and fourth input mixer circuits 735 and 740, third and fourth current controlled voltage source and filter circuits 745 and 750, third and fourth active filters 755 and 760, and third and fourth output mixer circuits 765 and 770, respectively. With the exception of the separate, second oscillator source 720 for the third and fourth input mixer circuits 735 and 740 and the third and fourth output mixer circuits 765 and 770, these components of the third and fourth filter paths 725 and 730 are functionally and structurally similar to the components of the first and second filter paths 225 and 230 described above. The structure and function of the first filter path 225, as described above, also applies to the third filter path 725, the fourth filter path 730, and the other filter paths. As a consequence, these components and their functionality as described above will not be described again in greater detail.

Accordingly, embodiments of the tunable multi-path filter 110 include a low-noise transconductance amplifier that converts a RF input signal into a radio frequency (RF) current signal, which is driven through input mixers into trans-impedance amplifiers for conversion into a baseband voltage for efficient high shape factor filtering. Use of the radio frequency current signal in this way may be referred to as a current mode conversion. This current mode conversion approach to multi-path (e.g., N-path) filtering allows for high input intercept point (IIP3) and bandwidth at relatively low power.

In some embodiments, the quality factor (Q) of the tunable multi-path filter 110 as described above may be over 1000 with greater than eighty decibels-per-decade (dB/dec) roll-off at a center frequency from about 0.1 gigahertz (GHz) to about 6.0 gigahertz (GHz) and a channel bandwidth of about 0.2 megahertz (MHz) to about 100 megahertz (MHz). In other embodiments, the tunable multi-path filter 110 provides other quality factor, decibel-per-decade roll-off, and bandwidth characteristics. Further, insertion loss and carrier feedthrough may be controlled internal or external to the tunable multi-path filter 110 using the functionality of the carrier signal rejection component 500 as described above. Additionally, gain and bandwidth of the tunable multi-path filter 110 may be tunable over several decades and the number of transition band poles may be adjustable from 2 poles to 6 poles by tuning the various tunable capacitors as described above. However, in some embodiments, the number of tunable decades and transition band poles are fewer or greater. In some embodiments, the tunable multi-path filter 110 may also have two separate clock frequencies to translate the spectrum to a different frequency band.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A tunable multi-path filter comprising:
a voltage controlled current source for receiving a radio frequency (RF) signal and generating a current signal;
an oscillator source for generating a tunable clock signal; and
at least two filter paths, each of the at least two filter paths coupled to the voltage controlled current source and the oscillator source, and configured to generate an output voltage signal based at least in part on the current signal and the tunable clock signal.

2. The tunable multi-path filter of claim 1, wherein the tunable multi-path filter has a bandpass filter response, and wherein the tunable clock signal sets a center frequency of the tunable multi-path filter.

3. The tunable multi-path filter of claim 1, wherein each of the at least two filter paths include
an input mixer circuit coupled to the voltage controlled current source and the oscillator source for mixing the current signal and the tunable clock signal to generate a mixed current signal;
a current controlled voltage source and filter circuit coupled to the input mixer circuit for filtering and converting the mixed current signal into a filtered voltage signal;
an active filter circuit coupled to the current controlled voltage source and filter circuit for filtering the filtered voltage signal to generate a second filtered voltage signal; and
an output mixer circuit coupled to the active filter circuit and the tunable clock signal for mixing the second filtered voltage signal and the tunable clock signal to generate the output voltage signal.

4. The tunable multi-path filter of claim 3, wherein the voltage controlled current source is a transconductance amplifier.

5. The tunable multi-path filter of claim 3, wherein the current controlled voltage source is a trans-impedance amplifier.

6. The tunable multi-path filter of claim 3, wherein the input mixer circuit and the output mixer circuit each include two or more switches controlled by the tunable clock signal.

7. The tunable multi-path filter of claim 3, further comprising a carrier signal rejection component coupled to the output mixer circuit and configured to reduce a carrier feedthrough in the output voltage signal.

8. The tunable multi-path filter of claim 7, wherein the carrier signal rejection component comprises:
an amplitude detector for generating an analog output based on an analog input;
an analog to digital converter for generating a digital output based on the analog output;
an electronic processor for performing a carrier feedthrough minimization algorithm to generate a minimization digital output based on the digital output; and
one or more digital-to-analog converters for generating a DC offset correction signal based on the minimization digital output, and for applying the DC offset correction signal to one selected from the group consisting of
the input mixer circuit,
the current controlled voltage source and filter circuit,
the active filter, and
the output mixer circuit.

9. The tunable multi-path filter of claim 8, wherein a sign and a magnitude of the DC offset correction signal is set by the carrier feedthrough minimization algorithm to reduce the carrier feedthrough, wherein the carrier feedthrough minimization algorithm iteratively sets different values of the sign and the magnitude of the DC offset correction signal when the electronic processor detects that an amplitude of the carrier feedthrough is above a threshold value.

10. The tunable multi-path filter of claim 1, further comprising a passive filter circuit coupled to the voltage controlled current source, wherein the passive filter circuit has a bandpass, low pass, or high pass filter response.

11. A method of filtering a radio frequency signal with a tunable multi-path filter, the method comprising:
receiving, with a voltage controlled current source, a radio frequency (RF) signal;
generating, with the voltage controlled current source, a current signal based on the radio frequency (RF) signal;
generating, with an oscillator source, a tunable clock signal; and
outputting, with at least two filter paths, at least two output voltage signals based at least in part on the current signal and the tunable clock signal.

12. The method of claim 11, further comprising tuning the tunable clock signal to set a center frequency of the tunable multi-path filter.

13. The method of claim 11, wherein the voltage controlled current source is a transconductance amplifier.

14. The method of claim 11, wherein outputting the at least two output voltage signals based at least in part on the current signal and the tunable clock signal further includes
   generating, with at least two input mixer circuits, at least two mixed current signals based on the current signal and the tunable clock signal;
   generating, with at least two current controlled voltage source and filter circuits, at least two filtered voltage signals based at least in part on the at least two mixed current signals, wherein the current controlled voltage source and filter circuit includes a trans-impedance amplifier;
   generating, with at least two active filter circuits, at least two second filtered voltage signals based on the at least two filtered voltage signals; and
   outputting, with at least two output mixer circuits, the at least two output voltage signals based on the at least two second filtered voltage signals and the tunable clock signal.

15. The method of claim 11, further comprising passively filtering, with a passive filter circuit coupled to the voltage controlled current source, the radio frequency signal, wherein the passive filter circuit has a bandpass filter response.

16. The method of claim 11, further comprising:
   generating, with an amplitude detector, an analog output based on an analog input;
   generating, with an analog to digital converter, a digital output based on the analog output;
   performing, with an electronic processor, a carrier feedthrough minimization algorithm to generate a minimization digital output based on the digital output; and
   generating, with one or more digital-to-analog converters, a DC offset correction signal based on the minimization digital output to reduce a carrier feedthrough from the oscillator source; and
   applying the DC offset correction signal to one selected from the group consisting of
   an input mixer circuit of the at least two filter paths,
   a current controlled voltage source and filter circuit of the at least two filter paths,
   an active filter of the at least two filter paths, and
   an output mixer circuit of the at least two filter paths.

17. The method of claim 16, further comprising detecting, by the electronic processor, whether the carrier feedthrough is above a threshold value.

18. The method of claim 17, wherein performing the carrier feedthrough minimization algorithm further includes
   controlling the one or more digital-to-analog converters to set a sign and a magnitude of the DC offset correction signal to reduce the carrier feedthrough; and
   iteratively controlling the one or more digital-to-analog converters to set different values of the sign and the magnitude of the DC offset correction signal when the electronic processor detects that the carrier feedthrough amplitude is above the threshold value.

19. The method of claim 11, wherein the at least two output voltage signals are a bandpass filter response of the radio frequency (RF) signal, wherein a center frequency of the bandpass filter response is set by the tunable clock signal, and wherein a bandwidth of the bandpass filter response is tunable and set, in each of the at least two filter paths, by at least one selected from a group consisting of
   a tunable resistor,
   a tunable capacitor, or
   a tunable inductor.

20. A communication device comprising:
   an antenna for receiving a radio frequency (RF) signal;
   a tunable multi-path filter having
      a voltage controlled current source for receiving the radio frequency (RF) signal and generating a current signal;
      an oscillator source for generating a tunable clock signal; and
      at least two filter paths, each of the at least two filter paths coupled to the voltage controlled current source and the oscillator source, and configured to generate an output voltage signal based at least in part on the current signal and the tunable clock signal; and
   a receiver configured to receive the output voltage signal from the at least two filter paths of the tunable multi-path filter.

* * * * *